(12) United States Patent
Benke et al.

(10) Patent No.: US 6,362,744 B1
(45) Date of Patent: Mar. 26, 2002

(54) APPARATUS FOR CHECKING AN ELECTRICAL DRIVE

(75) Inventors: Harald-Peter Benke, Kahl; Robert Horbach, Alzenau; Heinz Kutzer, Maintal, all of (DE)

(73) Assignee: Framatome ANP GmbH, Erlangen (DE)

( * ) Notice: Subject to any disclaimer, the term of this patent is extended or adjusted under 35 U.S.C. 154(b) by 0 days.

(21) Appl. No.: 09/568,939

(22) Filed: May 11, 2000

Related U.S. Application Data

(63) Continuation of application No. PCT/DE98/03170, filed on Oct. 29, 1998.

(30) Foreign Application Priority Data

Nov. 11, 1997 (DE) .......................................... 197 49 842

(51) Int. Cl.$^7$ .............................................. G08B 21/00
(52) U.S. Cl. ...................................................... 340/635
(58) Field of Search ................................. 340/635, 660, 340/664; 324/418, 424, 500, 601

(56) References Cited

U.S. PATENT DOCUMENTS

| | | | |
|---|---|---|---|
| 4,814,712 A | | 3/1989 | Burton et al. |
| 5,270,658 A | * | 12/1993 | Epstein ........................ 324/424 |
| 5,272,438 A | | 12/1993 | Stumme |
| 5,446,386 A | * | 8/1995 | Pollman et al. .............. 324/424 |
| 5,638,051 A | * | 6/1997 | Kutzer ........................ 340/635 |

FOREIGN PATENT DOCUMENTS

| | | |
|---|---|---|
| DE | 39 36 988 C2 | 11/1991 |
| DE | 3936 988 C2 * | 11/1991 |
| DE | 44 12 982 C1 | 9/1995 |
| DE | 196 32 457 C1 | 9/1997 |
| EP | 0 240 684 A1 | 10/1987 |
| EP | 0 609 261 B1 | 10/1995 |
| GB | 2 217 029 A | 10/1989 |

OTHER PUBLICATIONS

Published International Application No. WO 93/08482 (Kutzer), dated Apr. 29, 1993.

"Power Management Sleep–Mode Control for Microprocessors", dated Aug. 1993, IBM Technical Disclosure Bulletin, vol. 36, No. 08, pp. 189–190.

\* cited by examiner

*Primary Examiner*—Julie Lieu
(74) *Attorney, Agent, or Firm*—Herbert L. Lerner; Laurence A. Greenberg; Werner H. Stemer

(57) ABSTRACT

The apparatus checks the functionality of an electrical drive and/or of a mechanical device associated with the electrical drive. The mechanical device may be an accessory or an actuating element. An electrical unit is associated with the drive and/or with the mechanical device. The unit has connections to which a diagnosis module can be connected. A power supply device is provided for the diagnosis module which can be activated via at least one of the connections to the unit, or via an external signal.

20 Claims, 1 Drawing Sheet

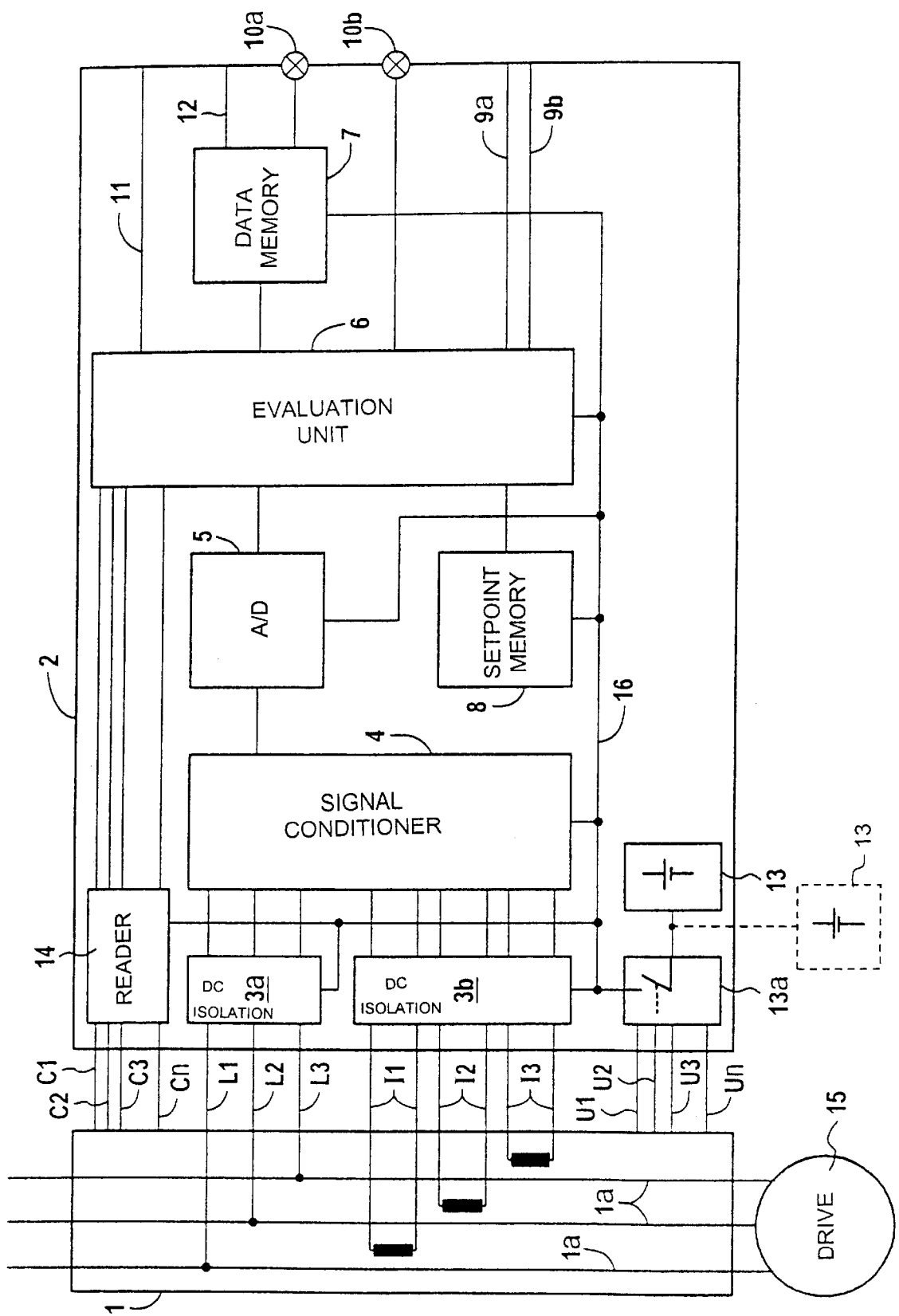

APPARATUS FOR CHECKING AN ELECTRICAL DRIVE

CROSS-REFERENCE TO RELATED APPLICATION

This is a continuation of copending international application PCT/DE98/03170, filed Oct. 29, 1998, which designated the United States.

BACKGROUND OF THE INVENTION

FIELD OF THE INVENTION

The invention relates to an apparatus for checking an electrical drive and/or a mechanical device which is associated with the drive. The mechanical device is, in particular, an accessory or an actuating element. A unit with connection terminals is associated with the drive and/or the mechanical device, and a diagnosis module can be connected to the connections of the unit.

An apparatus for checking an electrical drive and a mechanical device connected to it, which may be an accessory or an actuating element, is necessary in order to make it possible to monitor the functional state of the drive and/or of the actuating element. Continuous monitoring allows defects or changes in the operating behavior of the drive and/or of the mechanical device to be identified at an early stage. If the mechanical device is an accessory or an actuating element which, for example, may be part of a power station, changes and/or damage which do not yet adversely affect the reliability of the accessory or of the actuating element but can lead to safety-relevant damage or disturbances in operation can be identified at an early stage. A damaged or functionally defective drive and/or a damaged or functionally defective mechanical device can, in consequence, be identified at an early stage, and then serviced, repaired or replaced. The same applies in the situation where the electrical drive is associated with an actuating element in a rail system, wherein the actuating element may, in particular, be an actuating drive for a railroad switch.

U.S. Pat. No. 5,638,051 (European patent EP 0 609 261 B1) discloses a device for checking an electrical drive which is, in particular, a drive for an accessory. In this case, the drive has an associated unit in which voltage measurement lines originate from supply lines for the drive and end at voltage taps on the unit. Furthermore, the supply lines have associated current transformers in the unit, which are connected via current measurement lines to current taps on the unit. As a rule, the current transformers are associated with the supply lines without interrupting these supply lines, for example inductively. A diagnosis module can be connected to the terminals of the unit. In that prior art case, this diagnosis module is a diagnosis plug, which is connected to a central measurement and evaluation unit. The diagnosis plug receives signals which are present at the connections and passes them via a line to the measurement and evaluation unit.

German patent DE 39 36 988 C2 discloses a diagnosis module which is in the form of a plug and contains a signal-processing configuration. Since a drive must be monitored without any gaps, the arrangement must be connected to a supply voltage source all the time. Since suitable secondary energy is not available in the area of a drive to be monitored, the diagnosis module must either be externally supplied via a complex line, or it must be provided with a relatively large battery. Thus, until now, it has not been economically feasible to construct a diagnosis module which is not continuously connected to a centrally installed measurement and evaluation unit.

SUMMARY OF THE INVENTION

The object of the invention is to provide an apparatus for checking an electrical drive or actuating element and/or a mechanical device associated with the drive, which overcomes the above-noted deficiencies and disadvantages of the prior art devices and methods of this kind. The apparatus should comprise a diagnosis module which, on the one hand, does not need to be connected to a central evaluation unit throughout the checking operation and, furthermore, requires only a relatively small amount of supply power or a relatively small device for a power supply.

With the above and other objects in view there is provided, in accordance with the invention, an apparatus for checking a device such as an electrical drive and/or a mechanical component (e.g. an accessory or an actuator) associated with the drive, which comprises:

a unit associated with a device to be checked, said unit having a plurality of connections for carrying electrical signals;

a diagnosis module adapted to be connected to said connections of said unit;

a power supply device associated with said diagnosis module, said power supply device being activatable via at least one of said connections of said unit or via an external signal.

In other words, the objects of the invention are satisfied with the power supply device for the diagnosis module that can be activated via at least one of the connections to the unit or via an external signal.

This results in the advantage that the diagnosis module has two operating modes. As long as no signals to be processed are present, the module is in an energy-saving sleep mode or standby mode. If one or more signals are present, the module changes to the operating mode. Thus, little energy is consumed in the diagnosis module, even when no central measurement and evaluation unit is provided for one or more diagnosis modules. A small electrical energy store, for example a battery, or a small supply line with a small cross section is sufficient to satisfy the energy requirements of the diagnosis module.

It is particularly advantageous that, due to these features, the diagnosis module can be used successively at different times and locations on units for different drives, without any need for any impeding line connections, in particular data lines, to originate from the diagnosis module. In consequence, electrical drives at different locations can be checked quickly and easily.

By way of example, the diagnosis module has, as a power supply device, an associated electrical energy store and/or a voltage source, from which a supply line leads to the diagnosis module. The electrical energy store may be either rechargeable or not rechargeable. It may also be an electrical capacitor. Due to the sleep mode, such a power supply is sufficient for the power requirements of the diagnosis module.

The power supply device can be switched on, for example, via a signal, which is applied to at least one connection of the unit, of the operating voltage and/or of the operating current and/or of the control voltage and/or by another signal. The diagnosis module is thus activated only when, for example, the operating voltage and/or the control voltage are/is present at the drive. As long as the drive is at rest, the diagnosis module is also in the sleep mode. Since the electrical drive, which is associated, for example, with a mechanical device, is switched on only when the mechanical device is intended to be moved, the diagnosis module advantageously remains in the sleep mode for a very long time.

By way of example, a switch which is arranged in the supply line of the diagnosis module can be switched via a signal, which is supplied to the connection, of the operating voltage, of the operating current and/or of the control voltage of the drive and/or by another signal. This changes the diagnosis module to the operating mode.

With a supply line which can be interrupted by a switch, the diagnosis module manages with little energy for its own supply, since it assumes the sleep mode when the drive is stationary.

The diagnosis module contains, for example, an evaluation unit (processor). This achieves the advantage that the drive data read in are stored and/or evaluated and/or one or more new signals can be generated directly in the diagnosis module. There is then no need for a line connection to a central evaluation unit, or a low-power line is sufficient, since the majority of the evaluations are carried out in the diagnosis module itself. The power supply for such an evaluation unit in the diagnosis module is ensured by a small device, for example a battery, or a small supply line, since the diagnosis module is advantageously maintained in the sleep mode while the drive is stationary.

The diagnosis module can, for example, be calibrated and for this purpose has a calibration input and/or a calibration output which are/is connected, for example, to the evaluation unit. Known values can be fed in at any desired signal input, for example at the calibration input, after which actual values are output at the calibration output.

These actual values and the known values are used to determine the transfer function (calibration curve) for the diagnosis module, in particular the evaluation unit, generally outside the diagnosis module. This transfer function is stored in the diagnosis module, for example in the evaluation unit, once it has been entered, for example via the calibration input. In consequence, suitable values can be deduced to assess the drive or the mechanical device.

In accordance with an added feature of the invention, the diagnosis module has a data memory which is connected, for example, to the evaluation unit. Measured or calculated data can be stored there until the diagnosis module is connected, at a later point in time, to an external evaluation unit in order to read out and process the data further.

In accordance with an additional feature of the invention, there is provided a setpoint memory, which contains required values and can be connected to the evaluation unit in the diagnosis module. If it is found in the evaluation unit that measured or calculated values exceed or undershoot a setpoint value, a signal which characterizes the drive or the associated mechanical device can be output.

In accordance with another feature of the invention, one or more signaling apparatuses, for example light-emitting diodes, are connected to the evaluation unit and/or to the data memory. These are used to indicate that data are present or are stored.

The diagnosis module is, for example, in the form of a plug, and the connections to the unit are taps for holding the plug. This results in the advantage that the diagnosis module can be reconnected from one unit to another easily and quickly, so that a number of drives and/or associated mechanical devices can be checked in a short time.

According to another example, the diagnosis module may be a plug-in board, which can likewise easily be reconnected from one unit to another.

Finally, however, the diagnosis module may also be capable of being installed permanently and hardwired. In that case it is necessary for each unit to have such an associated diagnosis module.

According to another example, the diagnosis module may be a mobile module which can easily be reconnected and, by means of suitable apparatuses, may be associated with a number of drives or mechanical devices, for example in the common run of the power supply.

For example, the diagnosis module contains a read apparatus which is connected to a coding input which can be connected to a coding connection of the unit. Coding information is present at the coding connection of the unit and characterizes the drive to be checked or the mechanical device. This results in the advantage that, when checking an electrical drive or a mechanical device, this automatically identifies which of a large number of drives or mechanical devices in a system is connected to the diagnosis module.

The apparatus for checking an electrical drive or an associated mechanical device according to the invention results, in particular, in the advantage that a diagnosis module manages with sufficiently little energy that, in particular, an evaluation unit and/or a store can also be accommodated in the diagnosis module and can be supplied with energy, and that the diagnosis module is nevertheless sufficiently light and compact that it can be used successively on different units.

Other features which are considered as characteristic for the invention are set forth in the appended claims.

Although the invention is illustrated and described herein as embodied in an apparatus for checking an electrical drive, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawing.

BRIEF DESCRIPTION OF THE DRAWING

The sole drawing FIGURE is a schematic block diagram of a unit according to the invention.

DESCRIPTION OF THE PREFERRED EMBODIMENTS

Referring now to the FIGURE of the drawing in detail there is seen a unit 1 having connections C1 to Cn for coding signals, connections L1 to L3 for voltage signals, connections I1 to I3 for current signals, and connections U1 to Un for the operating or control voltage of a drive 15 that is to be checked. The voltage signals in the unit 1 originate directly from supply lines 1*a* for the drive 15. The connections I1 to I3 for current signals are associated in the unit 1 with the supply lines 1*a,* for example inductively. The drive 15 drives a mechanical device, which may be an accessory or an actuating element.

A diagnosis module 2, which may be in the form of a plug element, is connected to the unit 1. To this end, the connections C, U, L, I to the unit 1 are, for example, in the form of taps for holding contacts on the plug. The diagnosis module 2 may, however, also be permanently installed or may be installed separately. In the diagnosis module 2, the connections L1 to L3 for voltage signals are connected to a signal conditioner 4 via a module 3a to provide DC isolation. The connections I1 to I3 for current signals are connected to the signal conditioner 4 directly and/or via the same module or another module 3b for DC isolation. Externally, the signal conditioner 4 is connected to an evaluation unit 6 via an analog/digital converter 5.

The connections C1 to Cn for coding signals are also connected to the evaluation unit 6, via a read apparatus 14. In order to store data which are processed in the evaluation unit 6, this unit is externally connected to a data store 7.

On the input side, the evaluation unit 6 can be connected to a setpoint memory 8, in order to allow calculated values to be compared with a required value. The evaluation unit 6 is, furthermore, connected to a calibration input 9a and to a calibration output 9b. Actual values are obtained at the calibration output 9b, and the calibration curve is obtained from them, by feeding known values in at the calibration input 9a or at another input, for example from the setpoint memory 8. This calibration curve, or else a known calibration curve, can be fed into the evaluation unit 6 from the outside at the calibration input 9a. Signaling devices 10a, 10b, for example light-emitting diodes, which indicate whether data are present, may be connected to the evaluation unit 6 and/or to a data memory 7. Signaling apparatuses 10a, 10b may also be used for other purposes. Data output lines 11, 12 may originate from the evaluation unit 6 or from the memory 7, with connections via which data can be transmitted to a non-illustrated central evaluation unit.

The power supply for the diagnosis module 2 includes an electrical energy store 13, from which a system of supply lines 16 originates, which supplies the various components (energy loads) in the diagnosis module 2. The supply lines 16 may also be passed into the diagnosis module 2 from an external voltage source. The external energy source is indicated by the dashed box at the bottom of the FIGURE.

The operating voltage and/or the control voltage for the drive 15, which are/is present at the connections U1 to Un to the unit 1, are connected to a switch 13a in the supply line 16, which originates from the energy store 13 or from the non-illustrated voltage source.

When the drive 15 changes from the stationary state, then the electrical energy store 13 or the external voltage source is connected to the energy loads in the diagnosis module 2 as a result of the change that this causes to the voltage signals and/or the current signals and/or the operating or control voltage. As long as neither the stationary state nor an operating or control voltage is changed, the energy loads in the diagnosis module 2 are thus in the standby mode or sleep mode, so that a small energy store 13 and/or a small voltage source and/or small supply lines 16 are sufficient. The advantages of the invention are thus clear, namely that, for the first time, the diagnosis module 2 can be designed in a convenient manner with an integrated evaluation unit 6, so that it can easily be used successively on different units 1.

We claim:

1. An apparatus for checking a device, which comprises:
   a unit associated with a device to be checked, said unit having a plurality of connections for carrying electrical signals;
   a diagnosis module adapted to be connected to said connections of said unit;
   a supply line;
   a switch in said supply line;
   a power supply device connected to said diagnosis module through said supply line and said switch, said switch being switchable through an electrical signal, said power supply device being activatable via at least one of said connections of said unit or via an external signal.

2. The apparatus according to claim 1, wherein the device to be checked is an electrical drive and said unit is electrically connected to the drive.

3. The apparatus according to claim 1, wherein the device to be checked is a mechanical device associated with an electrical drive and said unit is electrically connected to the drive.

4. The apparatus according to claim 3, wherein the mechanical device is one of an accessory and an actuating element.

5. The apparatus according to claim 1, wherein said power supply device is an electrical energy store associated with said diagnosis module.

6. The apparatus according to claim 1, wherein said power supply device is a voltage source connected to said diagnosis module via said supply line.

7. The device according to claim 1, wherein said power supply device is connected to at least one of said connections and is switched on via a signal applied to said at least one connection.

8. The device according to claim 7, wherein the device to be checked is an electrical drive, said unit is electrically connected to the drive, and the signal is a signal selected from the group consisting of an operating voltage, an operating current, and a control voltage of the drive.

9. The apparatus according to claim 6, wherein the device to be checked is an electrical drive, and said switch is switchable via a signal, applied to said at least one connection, of one of an operating voltage, an operating current, and a control voltage of the drive.

10. The apparatus according to claim 1, wherein said diagnosis module contains an evaluation unit.

11. The apparatus according to claim 10, wherein said diagnosis module has a calibration input and a calibration output connected to said evaluation unit.

12. The apparatus according to claim 1, wherein said diagnosis module includes a data memory.

13. The apparatus according to claim 10, which comprises a setpoint memory connected to said evaluation unit.

14. The apparatus according to claim 10, which comprises a signaling apparatus connected to said evaluation unit.

15. The apparatus according to claim 1, wherein said diagnosis module is a plug device, and said connections of said unit are taps for holding said plug device.

16. The apparatus according to claim 1, wherein said diagnosis module is a plug-in board.

17. The apparatus according to claim 1, wherein said diagnosis module is hardwired to said unit.

18. The apparatus according to claim 1, wherein said diagnosis module is a mobile module.

19. The apparatus according to claim 1, wherein said diagnosis module includes a coding input and a read apparatus connected to said coding input.

20. The apparatus according to claim 19, wherein said unit has a coding connection connected to said coding input of said diagnosis module.

* * * * *